United States Patent [19]

Sano et al.

[11] Patent Number: 5,549,763
[45] Date of Patent: Aug. 27, 1996

[54] PHOTOVOLTAIC DEVICE

[75] Inventors: Keiichi Sano, Moriguchi; Yoichiro Aya, Hirakata; Norihiro Terada, Ikoma; Yasuki Harata, Hirakata, all of Japan

[73] Assignee: Sanyo Electric Co., Ltd., Moriguchi, Japan

[21] Appl. No.: 280,453

[22] Filed: Jul. 26, 1994

[30] Foreign Application Priority Data

Jul. 26, 1993 [JP] Japan ................................. 5-183802
May 19, 1994 [JP] Japan ................................. 6-129800

[51] Int. Cl.$^6$ ........................................... H01L 31/075
[52] U.S. Cl. .................... 136/255; 136/258; 136/259; 257/436; 257/458; 257/464; 257/465
[58] Field of Search ........................ 136/256, 258 AM, 136/259; 257/458, 436, 464–466

[56] References Cited

U.S. PATENT DOCUMENTS

| | | | |
|---|---|---|---|
| 4,956,685 | 9/1990 | Fischer et al. ........................... | 257/436 |
| 5,244,509 | 9/1993 | Arao et al. ............................... | 136/259 |
| 5,370,747 | 12/1994 | Noguchi et al. ........................ | 136/259 |

FOREIGN PATENT DOCUMENTS 3-46377  2/1991  Japan ............................. 136/258 AM

OTHER PUBLICATIONS

Extended Abstracts (The 52nd Autumn Meeting, 1991), The Japan Society of Applied Physics, 9p–D–8 (Translation)

Primary Examiner—Aaron Weisstuch
Attorney, Agent, or Firm—Armstrong, Westerman, Hattori, McLeland & Naughton

[57] ABSTRACT

In a photovoltaic device, when an internal electric field in a photoelectric conversion layer becomes non-uniform in the surface direction of the layer for a reason such as the interface between a transparent conductive film and the photoelectric conversion layer being formed in an irregular shape, the internal electric field in the photoelectric conversion layer is made uniform by (1) making the thickness of an intrinsic layer inside the photoelectric conversion layer in portions of the photoelectric conversion layer where the internal electric field becomes weak smaller than that in the other portions, (2) providing regions where conductivity is high and activation energy is low in the photoelectric conversion layer in the said portions, or (3) containing a ferroelectric material in a portion of the intrinsic layer inside the photoelectric conversion layer.

19 Claims, 10 Drawing Sheets

DISTANCE FROM INTERFACE
BETWEEN INTRINSIC LAYER
AND P-TYPE LAYER (μm)

PARTICLE DIAMETER (Å)

DISTANCE FROM INTERFACE
BETWEEN INTRINSIC LAYER
AND P-TYPE LAYER (Å)

PHOTOVOLTAIC DEVICE

BACKGROUND OF THE INVENTION

1. Field of the Invention

The present invention relates to a photovoltaic device for converting the energy of solar light or the like into electric energy.

2. Description of the Prior Art

As a photovoltaic device for converting the energy of solar light or the like into electric energy, photovoltaic devices having a variety of structures are known. One example of the photovoltaic devices is a photovoltaic device in which a transparent conductive film 2 composed of $SnO_2$, ITO or the like is provided on a transparent substrate 1, a photoelectric conversion layer 3 in which a p-type (or n-type) semiconductor layer 3a (or 3c), an intrinsic (i-type) semiconductor layer 3b, and an e-type (or p-type) semiconductor layer 3c (or 3a) are laminated is provided on the transparent conductive film 2, and a back electrode 4 composed of a high-reflective metal such as Ag or Al is provided on the photoelectric conversion layer 3.

In such a photovoltaic device, light is introduced into the above described photoelectric conversion layer 3 through the transparent conductive film 2 from the side of the above described transparent substrate 1 whereby carriers are generated in the above described intrinsic layer 3b to carry out a photoelectric conversion.

Furthermore, there has been developed in recent years a photovoltaic device so constructed that the interface between the transparent conductive film 2 and a photoelectric conversion layer 3 is so textured as to have an irregular shape so that reflection of light from the interface between the transparent conductive film 2 and the photoelectric conversion layer 3 is reduced when the light is introduced into the photoelectric conversion layer 3 through the transparent conductive film 2, thereby increasing the amount of the light introduced into the photoelectric conversion layer 3, and the light introduced into the photoelectric conversion layer 3 is scattered, thereby increasing the optical path length of the light passing through the photoelectric conversion layer 3, whereby many carriers are generated in the intrinsic layer 3b, thereby increasing the conversion efficiency as shown in FIG. 2.

If the interface between the transparent conductive film 2 and the photoelectric conversion layer 3 is formed in an irregular shape, however, the internal electric field in the photoelectric conversion layer 3 comprising a semiconductor junction which constituted by the p-type semiconductor layer 3a, the intrinsic layer 3b, and the n-type semiconductor layer 3c becomes non-uniform in the surface direction of the layer. As shown in FIG. 3, in a portion of the photoelectric converting layer 3 which is in contact with a recess 2a of the transparent conductive film 2 where much light is absorbed, the density of lines of electric force indicated by broken lines is decreased toward the transparent conductive film 2. Consequently, the interval between equipotential lines indicated by dot and dash lines is gradually increased toward the transparent conductive film 2, so that the internal electric field in the photoelectric conversion layer 3 in the portion which is in contact with the recess 2a of the transparent conductive film 2 becomes weak. In the portion of the photoelectric conversion layer 3 where the internal electric field becomes weak, many carriers recombine, whereby fill factor of the photovoltaic device is decreased, thereby preventing an improvement in conversion efficiency.

SUMMARY OF THE INVENTION

An object of the present invention is to obtain a photovoltaic device which is high in conversion efficiency by eliminating the possibility that the fill factor is decreased so as to prevent an improvement in conversion efficiency as in the conventional photovoltaic device, even when the internal electric field in the photoelectric conversion layer becomes non-uniform in the surface direction of the layer for reasons such as in the above described photovoltaic device.

Another object of the present invention is to make it possible to simply manufacture the above described photovoltaic device which is high in conversion efficiency.

According to the present invention, in a photovoltaic device in which a semiconductor layer for absorbing light to generate charge carriers is provided inside a photoelectric conversion layer, if the internal electric field in the photoelectric conversion layer becomes non-uniform in the surface direction of the layer, the thickness of the semiconductor layer for absorbing light to generate charge carriers in the portions of the photoelectric conversion layer where the internal electric field becomes weak is made smaller than that in the other portions. For example, in a photovoltaic device in which the interface between a photoelectric conversion layer and a transparent conductive film is formed in an irregular shape, the thickness of the semiconductor layer for absorbing light to generate charge carriers in the portions of the photoelectric conversion layer where the internal electric field becomes weak and which is in contact with the recesses of the transparent conductive film is made smaller than that in the other portions.

If the thickness of the semiconductor layer for absorbing light to generate charge carriers in the portions of the photoelectric conversion layer where the internal electric field becomes weak is thus smaller than that in the other portions, the internal electric field in the photoelectric conversion layer in these portions is substantially increased to make the internal electric field in the photoelectric conversion layer uniform, whereby the recombination of charge carriers in the portions where the internal electric field is weak is reduced. As a result, the decrease in the fill factor of the photovoltaic device is reduced, thereby improving conversion efficiency. Even in photovoltaic devices in which the interface between the photoelectric conversion layer and the transparent conductive film is formed in the irregular shape as described above, the decrease in the fill factor is reduced, thereby improving conversion efficiency.

Furthermore, in making the thickness of the semiconductor layer for absorbing light to generate charge carriers in the portions of the photoelectric conversion layer which is in contact with the recess of the transparent conductive film smaller than that in the other portions of the photovoltaic device in which the interface between the photoelectric conversion layer and the transparent conductive film is formed in the irregular shape as described above, the transparent conductive film is formed in an irregular shape utilizing changes in the intensity of light caused by interference fringes of the light, and the semiconductor layer for absorbing light to generate carriers is formed in an irregular shape utilizing the intensity of light caused by interference fringes of the light similarly to the transparent conductive film.

If irregularities are thus formed in the same manner in the transparent conductive film and the semiconductor Layer for absorbing light to generate charge carriers utilizing changes in the intensity of light caused by interference fringes of the light, the irregularities formed in the semiconductor layer for absorbing light to generate carriers correspond to the irregularities of the transparent conductive film. Therefore, in the portion of the photoelectric conversion layer which is in contact with the recess of the transparent conductive film, it is possible to decrease the thickness of the semiconductor layer for absorbing light to generate carriers simply and reliably. Even when the interface between the photoelectric conversion layer and the transparent conductive film is formed in the irregular shape as described above, it is possible to simply manufacture a photovoltaic device whose fill factor is not decreased and is high in conversion efficiency.

Furthermore, according to the present invention, in a photovoltaic device in which the internal electric field in the photoelectric conversion layer becomes non-uniform in the surface direction of the layer as described above, a region where conductivity is high and activation energy is low is provided in the portion of the photoelectric conversion layer where the internal electric field becomes weak. For example, in a photovoltaic device in which the interface between the photoelectric conversion layer and the transparent conductive film is in the irregular shape, a region where conductivity is high and activation energy is low is provided in the portion of the photoelectric conversion layer where the internal electric field becomes weak and which is in contact with the recess of the transparent conductive film.

If a region where conductivity is high and activation energy is low is thus provided in the portion of the photoelectric conversion layer where the internal electric field becomes weak, the internal electric field in the photoelectric conversion layer in this portion is increased to make the internal electric field in the photoelectric conversion layer uniform, whereby the recombination of charge carriers in the portion where the internal electric field is weak is reduced. As a result, the decrease in the fill factor in the photovoltaic device is reduced to improve the conversion efficiency. Even in a photovoltaic device in which the interface between the photoelectric conversion layer and the transparent conductive film is formed in the irregular shape as described above, the decrease in the fill factor is reduced, thereby improving the conversion efficiency.

Furthermore, according to the present invention, in a photovoltaic device in which the internal electric field in the photoelectric conversion layer becomes non-uniform in the surface direction of the layer as described above, a ferroelectric material such as $BaTiO_3$, $PbTiO_3$, $LiNbO_3$, $LiTaO_3$, or SbSI is contained in the semiconductor layer for absorbing light to generate charge carriers inside the photoelectric conversion layer in the portion of the photoelectric conversion layer where the internal electric field becomes weak. For example, in a photovoltaic device in which the interface between the photoelectric conversion layer and the transparent conductive film is formed in the irregular shape, the above described ferroelectric material is contained in a portion on the side of the transparent conductive film of the semiconductor layer for absorbing light to generate charge carriers in the portion of the photoelectric conversion layer where the internal electric field becomes weak which is in contact with the recess of the transparent conductive film.

If the ferroelectric material is contained in the semiconductor layer for absorbing light to generate charge carriers in the portion of the photoelectric conversion layer where the internal electric field becomes weak, lines of electric force are attracted by the ferroelectric material inside the photoelectric conversion layer, so that the density of the lines of electric force is increased in this portion. Consequently, the field intensity in the portion where the internal electric field becomes weak is increased to make the internal electric field uniform, thereby reducing the possibility that the charge carriers recombine in the portion where the internal electric field becomes weak. As a result, the decrease in the fill factor in the photovoltaic device is reduced, thereby improving the conversion efficiency. Even in a photovoltaic device in which the interface between the photoelectric conversion layer and the transparent conductive film is formed in the irregular shape as described above, the decrease in the fill factor is reduced, thereby improving the conversion efficiency.

The foregoing and other objects, features, aspects, and advantages of the present invention will become more apparent from the following detailed description of the present invention when taken in conjunction with the accompanying drawings.

DESCRIPTION OF THE PREFERRED EMBODIMENTS

Photovoltaic devices according to embodiments of the present invention will be specifically described on the basis of the attached drawings, and it will be made clear that the photovoltaic devices according to the embodiments are superior to the conventional photovoltaic devices.

Embodiment 1

Figure 4:
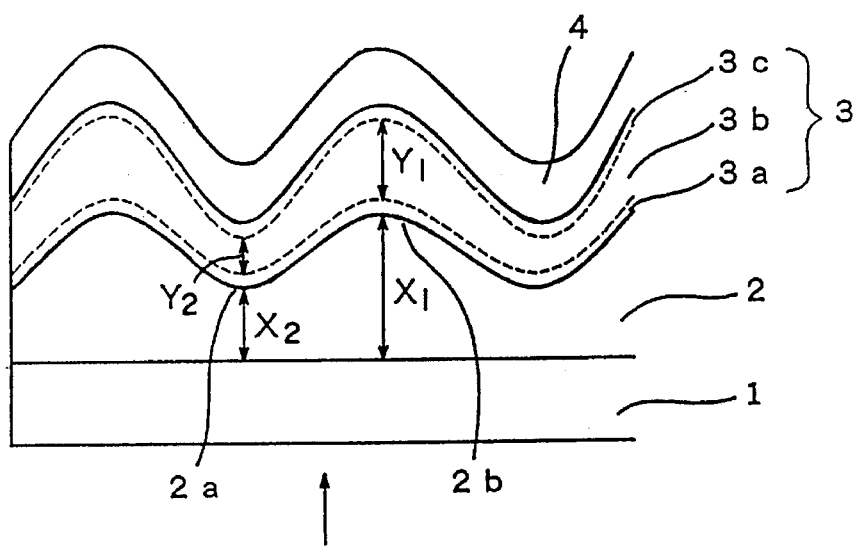
FIG. 4 is a schematic view showing a photovoltaic device according to an embodiment 1.

In a photovoltaic device according to the present embodiment, a transparent conductive film 2 composed of $SnO_2$ so textured that the surface thereof is in an irregular shape is formed on a transparent substrate 1 having insulating properties such as glass, a p-type semiconductor layer 3a composed of p-type amorphous silicon, an intrinsic layer 3b composed of amorphous silicon, and an n-type semiconductor layer 3c composed of n-type amorphous silicon are sequentially laminated on the transparent conductive film 2 as a photoelectric conversion layer 3 for carrying out a photoelectric conversion, and a back electrode 4 composed of a highly-reflective metal such as Ag or Al is provided on the photoelectric conversion layer 3, as shown in FIG. 4.

Figure 5:
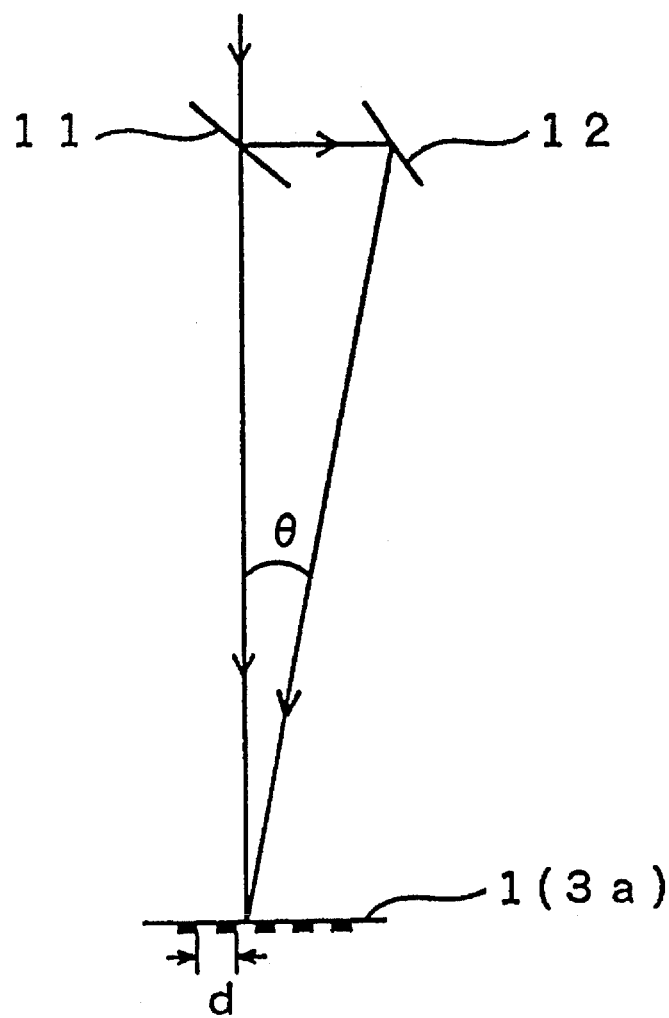
FIG. 5 is a schematic view for explaining a method of forming irregularities in a transparent conductive film and an intrinsic layer utilizing the intensity of light caused by interference fringes of the light in manufacturing the photovoltaic device according to the embodiment 1.

According to the present embodiment, in providing the transparent conductive film 2 on the transparent substrate 1 whose surface is in the irregular shape as described above, as seen in FIG. 5 laser light is introduced into a partially transmissive mirror 11, and approximately half of the laser light reaches the transparent substrate 1 on which the transparent conductive film 2 is formed through the partial mirror 11 while approximately half of the laser light is reflected from the partial mirror 11, and the reflected laser light is further reflected from a mirror 12 onto the transparent substrate 1. The angle θ between the laser light introduced into the transparent substrate 1 after passing through the mirror 11 and the laser light reflected from the mirror 12 onto the transparent substrate 1 is adjusted to produce interference fringes spaced at suitable intervals d on the transparent substrate 1.

The interval d between the interference fringes produced on the transparent substrate 1 is represented by the following equation, where λ is the wavelength of the above described laser light and n is the refractive index of the medium through which the laser light passes:

$$d=\lambda/(n \cdot \sin \theta)$$

In the present embodiment, ArF excimer laser light having a wavelength λ of 193 nm is used as the above described laser light to produce the interference fringes spaced at intervals d of approximately 1 μm on the above described transparent substrate 1 under the condition that the angle θ is 11° and the refractive index n is 1. $SnCl_4$ and $O_2$ are respectively applied as raw material gases at flow rates of 7 sccm and 350 sccm where the interference fringes are thus produced, and the substrate temperature is set to 400° C. and the pressure is set to 20 Torr, to form by a thermal CVD method the transparent conductive film 2 on the transparent substrate 1 whose surface is in an irregular shape.

When the transparent conductive film 2 composed of $SnO_2$ is thus formed on the transparent substrate 1, the deposition rate of the transparent conductive film 2 is approximately 200 Å/min. in portions which are irradiated with light, and approximately 100 Å/min. in portions which are not irradiated with light.

In the present embodiment, the transparent conductive film 2 is provided on the transparent substrate 1 in approximately 30 minutes using the technique as described above. Consequently, the thickness $X_1$ of a projection 2b of the transparent conductive film 2 is approximately 6000 Å and the thickness $X_2$ of a recess 2a thereof is approximately 3000 Å.

The p-type semiconductor layer 3a having a thickness of approximately 100 Å is formed on the thus formed transparent conductive film 2 by known methods such as a plasma CVD method.

Thereafter, as for the above described transparent conductive film 2, $Si_2H_6$ and $H_2$ are respectively supplied as raw material gases at flow rates of 50 sccm and 300 sccm while producing interference fringes of light spaced at intervals d of approximately 1 μm, the substrate temperature is set to 200° C., the pressure is set to 0.5 Torr, and the RF power is set to 10 mW/cm², thereby to form the intrinsic layer 3b in an irregular shape corresponding to the transparent conductive film 2 on the p-type semiconductor layer 3a by the plasma CVD method.

If the intrinsic layer 3b is formed in the above described manner, the deposition rate of the intrinsic layer 3b is approximately 60 Å/min. in the portions which are irradiated with light, and approximately 40 Å/min. in portions which are not irradiated with light.

In the present embodiment, the intrinsic layer 3b is provided on the p-type semiconductor layer 3a in approximately 50 minutes in the above described manner. Consequently, the thickness $Y_1$ of a portion of the intrinsic layer 3b which corresponds to the projection 2b of the transparent conductive film 2 is approximately 3000 Å, while the thickness $Y_2$ in a portion thereof which corresponds to the recess 2b is smaller, that is, approximately 2000 Å.

After the intrinsic layer 3b whose thickness is changed so as to correspond to the irregular shape of the transparent conductive film 2 is formed, the n-type semiconductor layer 3c having a thickness of approximately 300 Å and the back electrode 4 having a thickness of approximately 2000 Å are formed on the intrinsic layer 3b by known methods, thereby to obtain a photovoltaic device according to embodiment 1.

Figure 2:
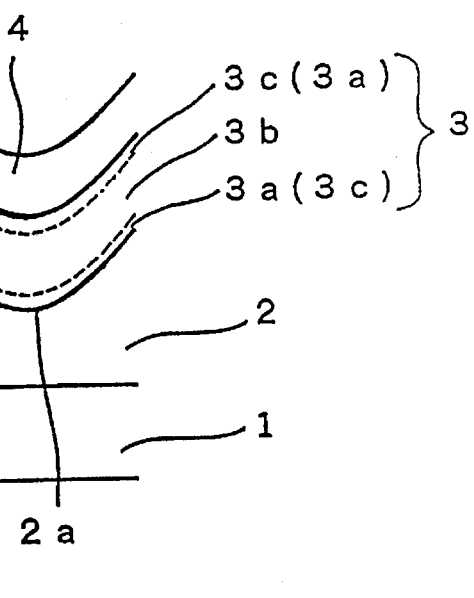
FIG. 2 is a schematic diagram showing a conventional photovoltaic device in which the interface between a transparent conductive film and a photoelectric conversion layer is formed in an irregular shape.
Figure 3:
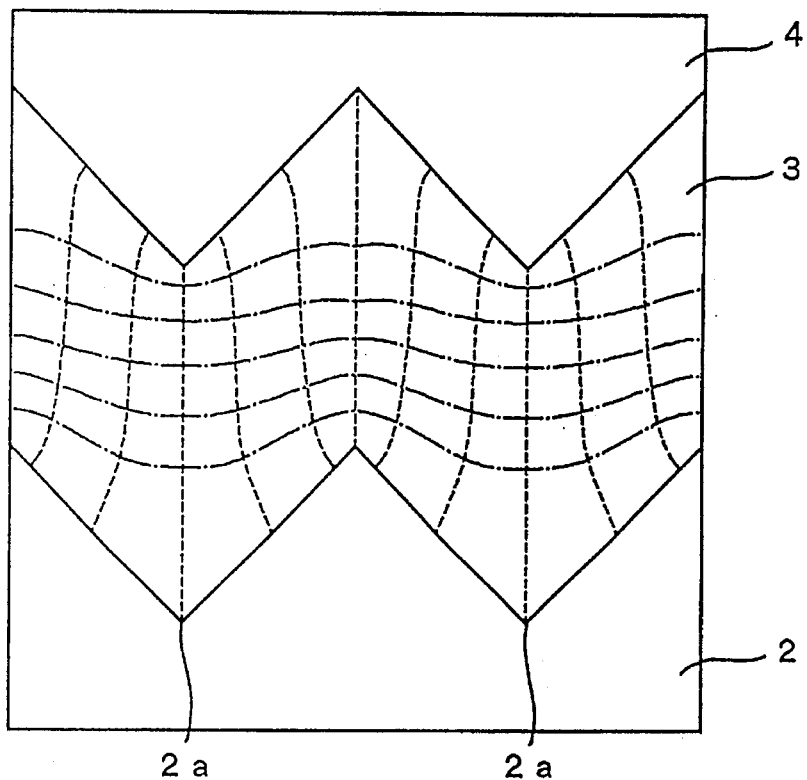
FIG. 3 is a partially enlarged view for explaining, in a photovoltaic device in which the interface between a transparent conductive film and a photoelectric conversion layer is formed in an irregular shape, a state where lines of electric force and equipotential lines are distributed in the photoelectric conversion layer.

For comparison with the photovoltaic device according to the present embodiment 1, a photovoltaic device in a comparative example 1 is manufactured in exactly the same manner as the photovoltaic device in the embodiment 1 except that the method of forming the intrinsic layer 3b is changed to form an intrinsic layer 3b having a substantially uniform thickness of approximately 3000 Å on the p-type semiconductor layer 3a as shown in FIG. 2, by the known method conventionally carried out.

The respective photovoltaic devices in the above described embodiment 1 and the comparative example 1 were irradiated with light under the same conditions to determine the open-circuit voltage (Voc), short-circuit current (Isc), fill factor (F. F.), and conversion efficiency (η) of the photovoltaic devices. The results are shown in the following table 1.

TABLE 1

|  | Voc (v) | Isc (mA/cm$^2$) | F.F. | η (%) |
| --- | --- | --- | --- | --- |
| Embodiment 1 | 0.900 | 16.5 | 0.740 | 11.0 |
| Comparative Example 1 | 0.895 | 16.7 | 0.685 | 10.2 |

As can be seen from the results, in the photovoltaic device of embodiment 1 in which the intrinsic layer 3b is formed in the irregular shape corresponding to the transparent conductive film 2 and the thickness of the intrinsic layer 3b in the portion which corresponds to the recess 2a of the transparent conductive film 2 is made smaller, the short-circuit current is hardly decreased, the fill factor is significantly improved, and the conversion efficiency is improved by approximately 0.8% irrespective of the fact that the thickness of the intrinsic layer 3b in the portion which corresponds to the recess 2a of the transparent conductive film 2 is decreased by two thirds, as compared with the photovoltaic device of the comparative example 1 in which the thickness of the intrinsic layer 3b is substantially uniform along the transparent conductive film 2.

The reason why the short-circuit current is hardly decreased in the photovoltaic device according to embodiment 1, as compared with the photovoltaic device of the comparative example 1 irrespective of the fact that the thickness of the intrinsic layer 3b is partially decreased as described above is considered to be as follows:

Specifically, in the intrinsic layer 3b in the portions of the photoelectric conversion layer 3 which are in contact with the recesses 2a of the transparent conductive film 2, the most light is absorbed in the portions of the intrinsic layer 3b near the portions on which light is incident, while little light is absorbed in the other portions. Even if the thickness of the intrinsic layer 3b in this portion is made smaller, therefore, the amount of charge carriers generated is hardly decreased. In addition, the decrease in the internal electric field in the photoelectric conversion layer 3 in the portions which are in contact with the recesses 2a of the transparent conductive film 2 is reduced, so that charge carriers generated in this portion are efficiently extracted. Further, the intrinsic layer 3b is formed in the irregular shape corresponding to the transparent conductive film 2, so that irregularities of the back electrode 4 are made larger than those in the photovoltaic device in the comparative example 1, resulting in an improved light trapping effect.

Although in the photovoltaic device according to embodiment 1, SnO$_2$ is used as the material composing the transparent conductive film 2, other known transparent conductive materials such as ZnO and ITO can be used. In addition, although in the photovoltaic device according to embodiment 1, amorphous silicon is used as a material composing the photoelectric conversion layer 3, other amorphous semiconductors and thin film compound semiconductors such as CuInSe$_2$ (copper●indium●selenium) may be used.

Furthermore, although according to embodiment 1, in making the thickness of the intrinsic layer 3b in the portion of the photoelectric conversion layer 3 which are in contact with the recesses 2a of the transparent conductive film 2 smaller than that in the other portions, the transparent conductive film 2 is provided with irregularities utilizing the variation in intensity of light caused by interference fringes of the light, and the intrinsic layer 3b in the photoelectric conversion layer 3 is provided with irregularities utilizing the variation in intensity of light caused by interference fringes of the light similarly to the transparent conductive film 2, the method of providing the transparent conductive film 2 and the intrinsic layer 3b with irregularities is not particularly limited to such a method. If the transparent conductive film 2 and the intrinsic layer 3b are provided with irregularities utilizing the variation in intensity of light caused by interference fringes of the light as described above, it is possible to decrease the thickness of the intrinsic layer 3b simply and reliably so as to correspond to the recesses 2a of the transparent conductive film 2.

Furthermore, although in providing the transparent conductive film 2 and the intrinsic layer 3b with irregularities utilizing the variation in intensity of light caused by interference fringes of the light as described above, the interval d between the interference fringes of the light is set to approximately 1 μm to provide the transparent conductive film 2 and the intrinsic layer 3b with irregularities with a pitch of approximately 1 μm in the present embodiment, the pitch of the irregularities provided for the transparent conductive film 2 and the intrinsic layer 3b may be in the range in which incident light is effectively scattered. The pitch is generally in the range of 0.1 to 10 μm, and preferably in the range of 0.3 to 1.5 μm.

Additionally, although in the photovoltaic device according to embodiment 1, the transparent conductive film 2 is so formed that the surface thereof is in the irregular shape during forming of the interface between the photoelectric conversion layer 3 and the transparent conductive film 2 in an irregular shape, the photovoltaic device may be one in which the surface of the transparent substrate 1 on which the transparent conductive film 2 is provided is formed in an irregular shape, the transparent conductive film 2 having a substantially uniform thickness is formed on the transparent substrate 1 having the irregular shape, and the interface between the transparent conductive film 2 and the photoelectric conversion layer 3 is formed in an irregular shape.

Although in the present embodiment, a photoelectric conversion layer 3 having a structure in which a p-type semiconductor layer 3a, an intrinsic layer 3b, and an n-type semiconductor layer 3c are sequentially laminated on the transparent conductive film 2 in the irregular shape is illustrated, it may have a structure in which an n-type semiconductor layer 3c, an intrinsic layer 3b, and a p-type semiconductor layer 3a are sequentially laminated.

Furthermore, in the photovoltaic device according to embodiment 1, only an example of a case where the interface between the photoelectric conversion layer 3 and the transparent conductive film 2 is formed in the irregular shape so that the internal electric field in the photoelectric conversion layer 3 becomes non-uniform in the surface direction of the layer is illustrated. Even when the internal electric field in the photoelectric conversion layer 3 becomes non-uniform in the surface direction of the layer due to other causes, however, it is possible to make the internal electric field in the photoelectric conversion layer 3 uniform to some extent so as to improve the fill factor of the photovoltaic device by making the thickness of the intrinsic layer $3b$ in the portions where the internal electric field is weak smaller than that in the other portions as described above.

Embodiment 2

Figure 6A:
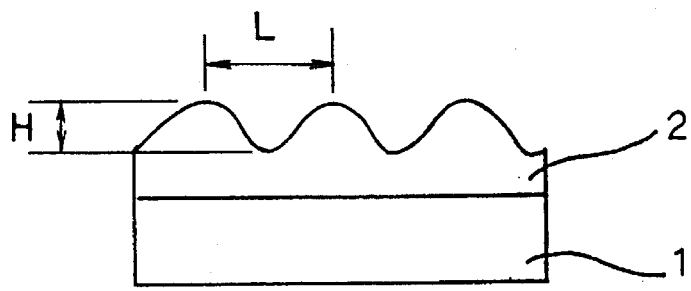
FIGS. 6(A), 6(B), and 6(C) are diagrams for explaining the steps of manufacturing a photovoltaic device according to an embodiment 2.
Figure 6B:
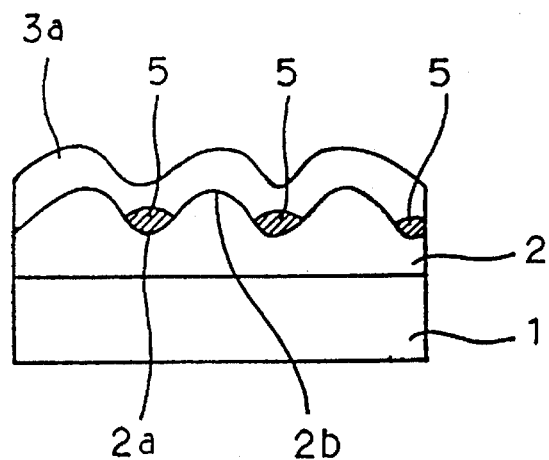
Figure 6C:
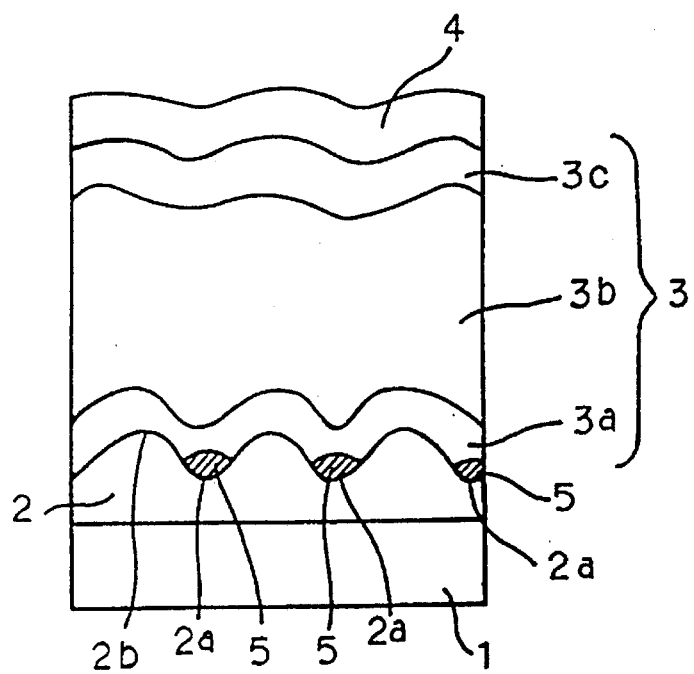

Referring to FIG. 6, in a photovoltaic device according to embodiment 2, a transparent conductive film 2 composed of $SnO_2$ so textured that the surface thereof is in an irregular shape is formed on a transparent substrate 1 having insulating properties such as glass, a p-type semiconductor layer $3a$ composed of p-type amorphous silicon carbide, an intrinsic layer $3b$ composed of amorphous silicon, and an n-type semiconductor layer $3c$ composed of n-type amorphous silicon are sequentially laminated as a photoelectric conversion layer 3 on the transparent conductive film 2, and a back electrode 4 composed of a highly-reflective metal such as Ag or Al is further provided on the photoelectric conversion layer 3, as shown in FIG. 6(C).

In the photovoltaic device according to the present embodiment 2, regions where the activation ratio of a dopant is high, that is, regions 5 where conductivity is high and activation energy is low is provided at portions of the p-type semiconductor layer $3a$ which are in contact with recesses $2a$ of the transparent conductive film 2 in the above described photoelectric conversion layer 3.

Description is now made of an example of a method of manufacturing the above described photovoltaic device.

In the present embodiment, the transparent conductive film 2 so textured that the surface thereof is in the irregular shape is first formed on the transparent substrate 1 by a CVD method or the like, as shown in FIG. 6(A). In forming the transparent conductive film 2 whose surface is in the irregular shape, the Haze ratio is set to not less than 10% and both the height from the bottom of the recesses $2a$ of the transparent conductive film 2 to the vertex of a projection $2b$ thereof and the distance between the vertexes are set in the range of 50 to 500 nm in the present embodiment.

The transparent substrate 1 on which the above described transparent conductive film 2 is formed is then placed in a chamber to form the p-type semiconductor layer $3a$ by a plasma CVD method or the like under the conditions shown in Table 2 on the transparent conductive film 2 and provide the regions 5 where the activation ration of a dopant is high in the portions of the p-type semiconductor layer $3a$ which are in contact with the recesses $2a$ of the transparent conductive film 2 as shown in FIG. 6(B). The thickness of the p-type semiconductor layer $3a$ is set in the range of 50 to 200 Å.

Figure 7:
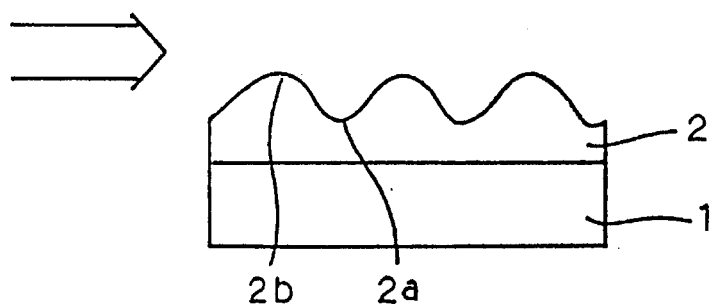
FIG. 7 is a diagram for explaining a method of providing a region where the activation ratio of a dopant is high in a recess of a transparent conductive film in forming a p-type semiconductor layer on a transparent conductive film in the photovoltaic device according to embodiment 2.

In providing the region 5 where the activation ratio of a dopant is high in the portions of the p-type semiconductor layer $3a$ which are in contact with the recesses $2a$ of the transparent conductive film 2, gas ports (not shown) are disposed around the transparent substrate 1, and a raw material gas is introduced in parallel with the surface of the transparent substrate 1, as shown in FIG. 7, from each of the gas ports.

If the raw material gas is thus introduced in parallel with the surface of the transparent substrate 1, the raw material gas directly strikes the projection $2b$ of the transparent conductive film 2, while not directly striking the recesses $2a$. Consequently, a temperature difference arises between the projections $2b$ and the recesses $2a$ of the transparent conductive film 2, that is, the temperature of the recesses $2a$ is higher than that of the projections $2b$. The temperature difference between the recesses $2a$ and the projections $2b$ of the transparent conductive film 2 is changed depending on the gas flow rate of the raw material gas. This temperature difference is 20° to 30° C. when the gas flow rate is approximately 100 sccm. The larger the gas flow rate is, the larger the temperature difference is. The temperature difference is not less than 50° C. when the gas flow rate is not less than 1 SLM.

Figure 8:
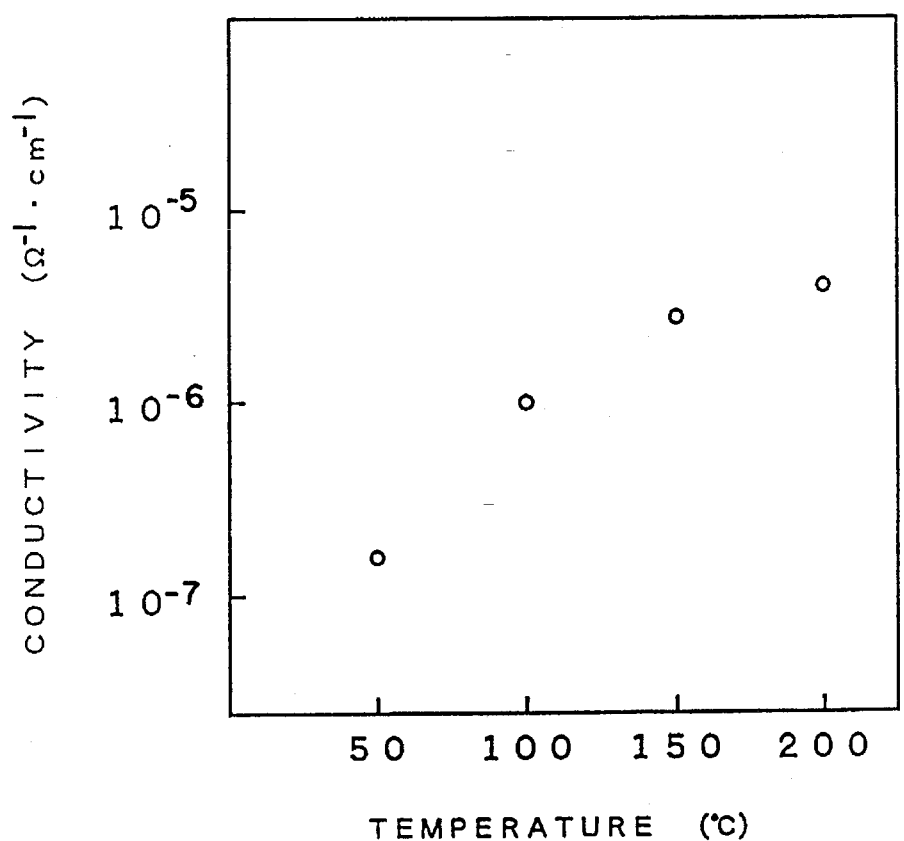
FIG. 8 is a diagram showing the relationship between the temperature during forming of the p-type semiconductor layer and the conductivity in the formed p-type semiconductor layer in the photovoltaic device according to embodiment 2.

If the temperature difference thus arises between the recesses $2a$ and the projections $2b$ of the transparent conductive film 2, the conductivities of the p-type semiconductor layer $3a$ formed on the recesses $2a$ and the projection $2a$ of the transparent conductive film 2 is different, so that the regions 5 where conductivity is high, that is, the regions 5 where the activation ratio of a dopant is high is formed on the recesses $2a$ of the transparent conductive film 2 whose temperature is higher. Specifically, when the p-type semiconductor layer $3a$ is formed, the conductivity of the p-type semiconductor layer $3a$ in the portions where the p-type semiconductor layer $3a$ is formed over recesses $2a$ is generally increased if the temperature of these portions is increased, as shown in FIG. 8.

In the present embodiment, the gas flow rate of the raw material gas is set to a total of approximately 1.5 SLM, and the regions 5 where the activation ratio of a dopant is high are provided in the portions of the p-type semiconductor layer $3a$ which are in contact with the recesses $2a$ of the transparent conductive film 2 due to the temperature difference between the projections $2b$ and the recesses $2a$ of the transparent conductive film 2. If the temperature at which the p-type semiconductor layer $3a$ is formed is above 250° C., the difference in the conductivity due to the temperature difference is decreased. Accordingly, the p-type semiconductor layer $3a$ is formed in such a manner that the temperature in the recesses $2a$ of the transparent conductive film 2 is not more than 150° C.

After the p-type semiconductor layer $3a$ is thus formed on the transparent conductive film 2, the intrinsic layer $3b$ composed of amorphous silicon and the n-type semiconductor layer $3c$ composed of n-type amorphous silicon are sequentially laminated on the p-type semiconductor layer $3a$, as shown in FIG. 6(C), under the conditions indicated by the following table 2 by the plasma CVD method or the like, and the back electrode 4 is further provided on the n-type semiconductor layer $3c$. In the present embodiment, the thickness of the intrinsic layer $3b$ is set in the range of 3000 to 7000 Å, the thickness of the n-type semiconductor layer $3c$ is set in the range of 50 to 400 Å, and the thickness of the back electrode 4 is set to not less than 3000 Å.

TABLE 2

| | substrate temperature (°C.) | pressure (Pa) | RF power (mW/cm$^2$) | gas flow rate (sccm) |
| --- | --- | --- | --- | --- |
| p-type semiconductor layer | 80–150 | 6.7–53.2 | 10–80 | SiH$_4$: 50–100<br>0.1% B$_2$H$_6$H$_2$: 5–10<br>100% CH$_4$: 25–50<br>H$_2$: 1000–1600 |

TABLE 2-continued

| | substrate temperature (°C.) | pressure (Pa) | RF power (mW/cm²) | gas flow rate (sccm) |
|---|---|---|---|---|
| intrinsic layer | 150–250 | 6.7–26.6 | 10–50 | SiH$_4$: 20–200 |
| n-type semiconductor layer | 150–250 | 6.7–26.6 | 10–50 | SiH$_4$: 20–200<br>1% PH$_3$/H$_2$: 5–20 |

In the photovoltaic device according to embodiment 2, the regions 5 where the activation ratio of a dopant is high is provided in the portions of the p-type semiconductor layer 3a which are in contact with the recesses 2a of the transparent conductive layer 2 in the photoelectric conversion layer 3 as described above. Accordingly, the offset of the internal electric field in the photoelectric conversion layer 3 is reduced, so that the internal electric field in the photoelectric conversion layer 3 is made uniform even if the transparent conductive film 2 so textured that the surface thereof is in the irregular shape is formed on the transparent substrate 1, thereby reducing the possibility that the internal electric field is lowered in the portions of the photoelectric conversion layer 3 which are in contact with the recesses 2a of the transparent conductive film 2. As a result, the possibility that charge carriers generated in the photoelectric conversion layer 3 recombine in the portion of the p-type semiconductor layer 3a which are in contact with the recesses 2a of the transparent conductive film 2 is reduced, whereby the fill factor of the photovoltaic device is improved, thereby improving conversion efficiency.

For comparison with the photovoltaic device according to embodiment 2, a photovoltaic device of a comparative example 2 is manufactured in exactly the same manner as the photovoltaic device of embodiment 2 except that the region 5 where the activation ratio of a dopant is high is not provided in the portions of the p-type semiconductor layer 3a which are in contact with the recesses 2a of the transparent conductive film 2.

The respective photovoltaic devices of embodiment 2 and the comparative example 2 were irradiated with light under the same conditions, to measure the open-circuit voltage (Voc), short-circuit current (Isc), fill factor (F.F.), and conversion efficiency (η). The results are shown in the following table 3.

TABLE 3

| | Voc (v) | Isc (mA/cm²) | F.F. | η (%) |
|---|---|---|---|---|
| Embodiment 2 | 0.897 | 17.2 | 0.738 | 11.4 |
| Comparative Example 2 | 0.897 | 17.1 | 0.719 | 11.0 |

As can be seen from the results, in the photovoltaic device of embodiment 2 in which the regions 5 where the activation ratio of a dopant is high is provided in the portions of the p-type semiconductor layer 3a which are in contact with the recesses 2a of the transparent conductive film 2, the short-circuit current is slightly improved, the fill factor is improved, and the conversion efficiency is improved by approximately 0.4%, as compared with the photovoltaic device of the comparative example 2 in which the regions 5 where the activation ratio of a dopant is high are not provided.

Although in the present embodiment, a photoelectric conversion layer 3 having a structure in which a p-type semiconductor layer 3a, an intrinsic layer 3b, and an n-type semiconductor layer 3c are sequentially laminated on a transparent conductive film 2 in an irregular shape is illustrated, it may have a structure in which an n-type semiconductor layer 3c, an intrinsic layer 3b, and a p-type semiconductor layer 3a are sequentially laminated. In this case, the regions 5 where the activation ratio of a dopant is high are provided in the portions of the n-type semiconductor layer 3c which are in contact with the recesses 2a of the transparent conductive film 2.

Furthermore, also in the photovoltaic device according to embodiment 2, only an example of the case where the interface between the photoelectric conversion layer 3 and the transparent conductive film 2 is formed in the irregular shape so that the internal electric field in the photoelectric conversion layer 3 becomes non-uniform in the surface direction of the layer is illustrated. Even when the internal electric field in the photoelectric conversion layer 3 becomes non-uniform in the surface direction of the layer due to other causes, however, it is possible to make the internal electric field in the photoelectric conversion layer 3 uniform to some extent so as to improve the fill factor of the photovoltaic device by providing the regions 5 where the activation ratio of a dopant is high in the portions of the photoelectric conversion layer 3 where the internal electric field becomes weak as described above.

Embodiment 3

A photovoltaic device according to embodiment 3 is approximately the same as the photovoltaic device according to the above described embodiment 2. In the photovoltaic device according to embodiment 3, however, in providing regions 5 where conductivity is high and activation energy is low in portions of a p-type semiconductor layer 3a which are in contact with recesses 2a of a transparent conductive film 2 in a photoelectric conversion layer 3, regions 5 are provided where the amount of doping of impurities is large.

In providing the regions 5 where the amount of doping of impurities is large in the portions of the p-type semiconductor layer 3a which are in contact with the recesses 2a of the transparent conductive film 2, the transparent conductive film 2 is formed in an irregular shape on a transparent substrate 1 in the same manner as that in the above described embodiment 2, after which a raw material gas containing a large amount of boron as an impurity in which the gas flow ratio of B$_2$H$_6$:SiH$_4$ is not less than 5% is first used and is supplied in the direction perpendicular to the transparent substrate 1 in such a manner that the substrate temperature, pressure, and RF power are the same as in the above described embodiment 2.

Consequently, an amorphous silicon carbide containing a high concentration of boron dopant impurities is accumulated in the recesses 2a of the above described transparent conductive film 2, so that regions 5 where the amount of doping of impurities is large are formed on the recesses 2a of the transparent conductive film 2. In the present embodiment, an adjustment is made such that the thickness of the above described regions 5 in the recesses 2a of the transparent conductive film 2 is not more than approximately 10 Å.

Figure 9A:
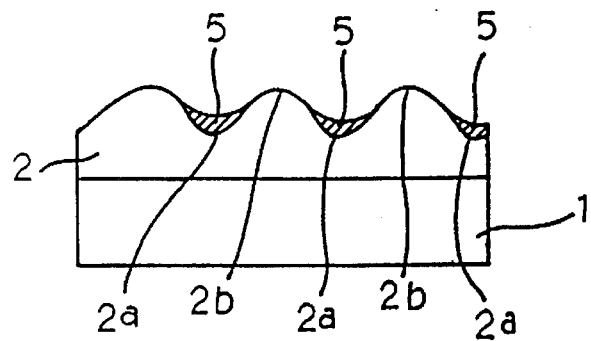
FIGS. 9(A) and 9(B) are diagrams for explaining a method of providing a region where the amount of doping of impurities is high in a recess of a transparent conductive film during forming of a p-type semiconductor layer on the transparent conductive film in a photovoltaic device according to embodiment 3.
Figure 9B:
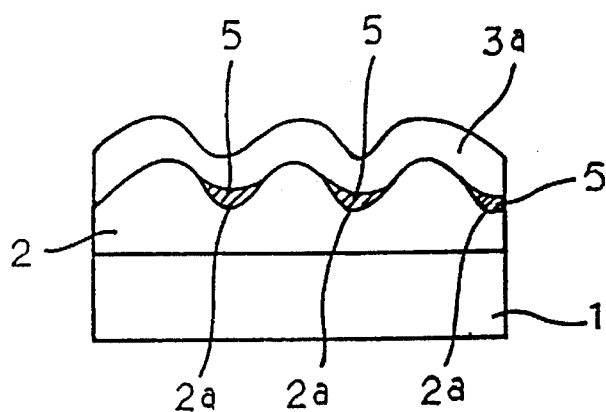

After the regions 5 where the amount of doping impurities is large, that is, the regions 5 where conductivity is high and activation energy is low are formed on the recesses 2a of the transparent conductive film 2, a raw material gas in which the gas flow ratio of $B_2H_6:SiH_4$ is not more than 5% is used and is supplied in the direction perpendicular to the transparent substrate 1, to form an ordinary p-type semiconductor layer 3a on the above described transparent conductive film 2, as shown in FIG. 9(B). Thereafter, an intrinsic layer 3b and an n-type semiconductor layer 3c are sequentially laminated on the p-type semiconductor layer 3a, and a back electrode 4 is further provided on the n-type semiconductor layer 3c, in the same manner as in the above described embodiment 2.

In the photovoltaic device according to embodiment 3, regions 5 where the amount of doping of impurities is large are provided in the portions of the p-type semiconductor layer 3a which are in contact with the recesses 2a of the transparent conductive film 2. Accordingly, the offset of the internal electric field in the photoelectric conversion layer 3 is reduced, so that the internal electric field in the photoelectric conversion layer 3 is made uniform even if the transparent conductive film 2 so textured that the surface thereof is in an irregular shape is formed on the transparent substrate 1, thereby reducing the possibility that the internal electric field is lowered in the portions of the photoelectric conversion layer 3 which are in contact with the recesses 2a of the transparent conductive film 2, as in the photovoltaic device of embodiment 2. As a result, the possibility that carriers generated in the photoelectric conversion layer 3 recombine in the portions of the p-type semiconductor layer 3a which are in contact with the recesses 2a of the transparent conductive film 2 is reduced, whereby the fill factor in the photovoltaic device is improved to improve conversion efficiency.

Although in the present embodiment, a photoelectric conversion layer 3 having a structure in which a p-type semiconductor layer 3a, an intrinsic layer 3b, and an n-type semiconductor layer 3c are sequentially laminated is illustrated, it may have a structure in which an n-type semiconductor layer 3c, an intrinsic layer 3b, and a p-type semiconductor layer 3a are sequentially laminated. In this case, the regions 5 where the amount of doping of impurities is large are provided in the portions of the n-type semiconductor layer 3c which are in contact with the recesses 2a of the transparent conductive film 2.

Furthermore, also in the photovoltaic device according to embodiment 3, only an example of a case where the interface between the photoelectric conversion layer 3 and the transparent conductive film 2 is formed in the irregular shape so that the internal electric field in the photoelectric conversion layer 3 becomes non-uniform in the surface direction of the layer is illustrated. Even when the internal electric field in the photoelectric conversion layer 3 becomes non-uniform in the surface direction of the layer due to the other causes, however, it is possible to make the internal electric field in the photoelectric conversion layer 3 uniform to some extent so as to improve the fill factor in the photovoltaic device by providing the regions 5 where the amount of doping of impurities is large in the portions of the photoelectric conversion layer 3 where the internal electric field becomes weak as described above.

Embodiment 4

A photovoltaic device according to embodiment 4 is also approximately the same as the photovoltaic device according to the above described embodiment 2. In the photovoltaic device according to the embodiment 4, however, in providing a region 5 where conductivity is high and activation energy is low in portions of a p-type semiconductor layer 3a which are in contact with recesses 2a of a transparent conductive film 2 in a photoelectric conversion layer 3, the portions of the p-type semiconductor layer 3a composed of an amorphous semiconductor as described above which are in contact with the recesses 2a of the transparent conductive film 2 are microcrystallized.

Figure 10:
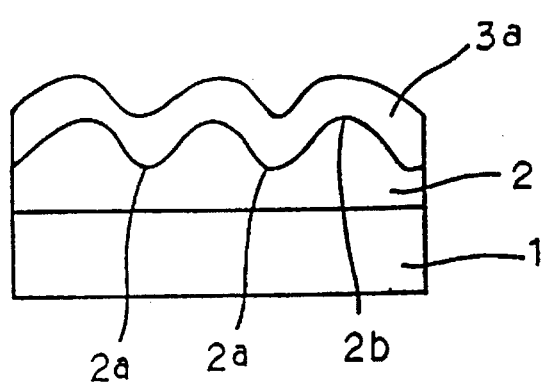
FIG. 10 is a schematic view showing a state where a p-type semiconductor layer is formed on a transparent conductive film in a photovoltaic device according to embodiment 4.

In microcrystallizing the portions of the p-type semiconductor layer 3a which are in contact with the recesses 2a of the transparent conductive film 2, a p-type semiconductor layer 3a composed of p-type amorphous silicon carbide is formed on the transparent conductive film 2 by a standard plasma CVD method or the like, as shown in FIG. 10, after which the portions of the p-type semiconductor layer 3a which are in contact with the recesses 2a of the transparent conductive film 2 are microcrystallized utilizing a solid phase crystallization method or a laser.

Description is now made of a method of microcrystallizing the portions of the p-type semiconductor layer 3a which are in contact with the recesses 2a of the transparent conductive film 2 utilizing the solid phase crystallization method.

With reference to the microcrystallization of amorphous silicon, a crystalline nucleus is easily formed in a location where the strain energy of a starting material is large, according to a publication describing an experiment wherein polycrystalline silicon is formed by a solid phase crystallization method (T. Matusyama et al. "HIGH-QUALITY POLYCRYSTALLINE SILICON THIN FILMS PREPARED BY SOLID PHASE CRYSTALLIZATION (SPC) METHOD", Proc. of the MRS Fall Meeting, Nov. 30–Dec. 4, 1992, Boston).

In the present embodiment, the experimental fact that a crystalline nucleus is easily formed in a location where the strain energy of a starting material is large as described above is utilized to selectively microcrystallize the portions of the p-type semiconductor layer 3a where the strain energy is large and which are in contact with the recesses 2a of the transparent conductive film 2.

More specifically, p-type semiconductor layer 3a composed of p-type amorphous silicon carbide is formed on the transparent conductive film 2 by a plasma CVD method or the like, after which the transparent substrate 1 on which the p-type semiconductor layer 3a is thus formed is heat-treated for a short time, to microcrystallize the portions of the p-type semiconductor layer 3a which are in contact with the recesses 2a of the transparent conductive film 2. In heat-treating the transparent substrate 1, the heat treatment is generally carried out at temperatures of 500° to 600° C. when the thickness of the p-type semiconductor layer 3a is 100 Å, for example, and the heat treatment time is controlled to stop solid phase crystallization (SPC) if a desired crystalline nucleus is formed so that the portions of the p-type semiconductor layer 3a which are in contact with the recesses 2a of the transparent conductive film 2 are selectively microcrystallized.

Figure 11:
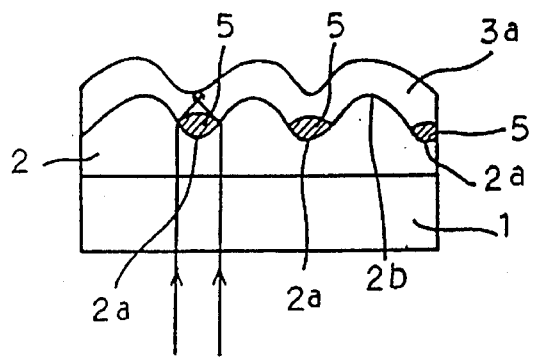
FIG. 11 is a schematic view showing a state where a portion of the p-type semiconductor layer on a recess of the transparent conductive film is microcrystallized by a laser in the photovoltaic device according to embodiment 4.

Furthermore, according to the present embodiment, in microcrystallizing the portions of the p-type semiconductor layer 3a which are in contact with the recesses 2a of the transparent conductive film 2 using a laser, the p-type semiconductor layer 3a is formed on the transparent conductive film 2 as described above, after which laser light is incident from the side of the transparent substrate 1, as shown in FIG. 11. If the laser light is thus incident from the side of the transparent substrate 1 the laser light is refracted by the difference in the refractive index between the transparent conductive film 2 and the p-type semiconductor layer 3a and is concentrated on the portions of the p-type semiconductor layer 3a which are in contact with the recesses 2a of the transparent conductive film 2, as shown in FIG. 11, whereby only the portions which are in contact with the recesses 2a of the transparent conductive film 2 are selectively microcrystallized.

After the portions of the p-type semiconductor layer 3a which are in contact with the recesses 2a of the transparent conductive film 2 are microcrystallized utilizing the solid phase crystallization method and the laser as described above, the photovoltaic device is manufactured in the same manner as the photovoltaic device in the above described embodiment 2.

In the photovoltaic device according to the present embodiment 4 thus manufactured, the offset of the internal electric field in the photoelectric conversion layer 3 is reduced, so that the internal electric field in the photoelectric conversion layer 3 is made uniform even if the transparent conductive film 2 so textured that the surface thereof is in an irregular shape is formed on the transparent substrate 1, thereby reducing the possibility that the internal electric field is lowered in the portions of the photoelectric conversion layer 3 which are in contact with the recesses 2a of the transparent conductive film 2, as in the above described photovoltaic device according to the above described embodiment 2. As a result, the possibility that charge carriers generated in the photoelectric conversion layer 3 recombine in the portions of the p-type semiconductor layer 3a which are in contact with the recesses 2a of the transparent conductive film 2 is reduced, whereby the fill factor in the photovoltaic device is improved thereby increasing the conversion efficiency.

For comparison with the photovoltaic device according to embodiment 4, a photovoltaic device of a comparative example 3 is manufactured in exactly the same manner as the photovoltaic device in the above described embodiment 4 except that the portions of the p-type semiconductor layer 3a which are in contact with the recesses 2a of the transparent conductive film 2 are not microcrystallized.

Figure 12:
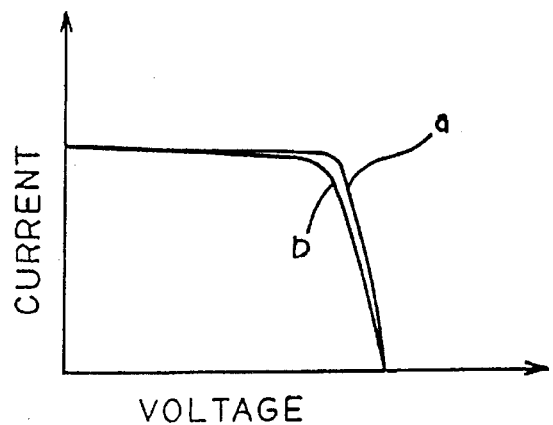
FIG. 12 is a graph in which current-voltage characteristics in the photovoltaic device according to embodiment 4 and a photovoltaic device in a comparative example 3 are compared with each other.

The respective photovoltaic devices of embodiment 4 and comparative example 3 were irradiated with light under the same conditions (AM 1.5 and 100 Mw/cm$^2$), to measure the open-circuit voltage (Voc), short circuit current (Isc), fill factor (F.F.), and conversion efficiency ($\eta$) of the photovoltaic devices. The results are shown in the following table 4, and output characteristics (I–V curves) of the above described photovoltaic devices are shown in FIG. 12. In FIG. 12, a represents the I–V curve of the photovoltaic device of embodiment 4, and b represents the I–V curve of the photovoltaic device of the comparative example 3.

TABLE 4

| | Voc (V) | Isc (Ma/cm$^2$) | F.F. | $\eta$ (%) |
|---|---|---|---|---|
| Embodiment 4 | 0.891 | 17.3 | 0.738 | 11.4 |
| Comparative Example 3 | 0.897 | 17.2 | 0.719 | 11.1 |

As can be seen from the results, in the photovoltaic device of embodiment 4 in which the portions of the p-type semiconductor layer 3a which are in contact with the recesses 2a of the transparent conductive film 2 are microcrystallized, the short-circuit current is slightly improved, the fill factor is improved, and the conversion efficiency is improved by approximately 0.3%, as compared with the photovoltaic device of the comparative example 3 in which the portions of the p-type semiconductor layer 3a are not microcrystallized.

Although in the present embodiment, only a photoelectric conversion layer 3 having a structure in which a p-type semiconductor layer 3a, an intrinsic layer 3b, and an n-type semiconductor layer 3c are sequentially laminated is illustrated, it may also have a structure in which an n-type semiconductor layer 3c, an intrinsic Layer 3b, and a p-type semiconductor layer 3a are sequentially laminated. In this case, the portions of the n-type semiconductor layer 3c which are in contact with the recesses 2a of the transparent conductive film 2 are microcrystallized.

Furthermore, also in the photovoltaic device according to embodiment 4, only an example of a case where the interface between the photoelectric conversion layer 3 and the transparent conductive film 2 is formed in the irregular shape so that the internal electric field in the photoelectric conversion layer 3 becomes non-uniform in the surface direction of the layer is illustrated. Even when the internal electric field in the photoelectric conversion layer 3 becomes non-uniform in the surface direction of the layer due to other causes, however, it is still possible to make the internal electric field in the photoelectric conversion layer 3 uniform to some extent to improve the fill factor in the photovoltaic device by noncrystallizing the amorphous semiconductor in the portion of the photoelectric conversion layer 3 where the internal electric field becomes weak as described above.

Embodiment 5

Figure 13:
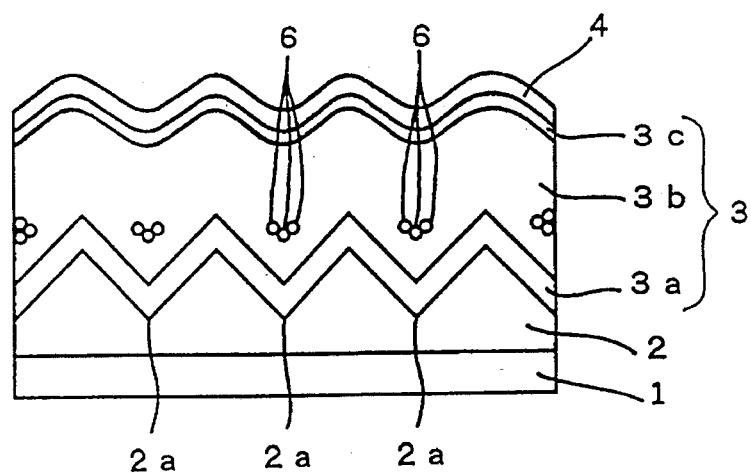
FIG. 13 is a schematic view showing a photovoltaic device according to embodiment 5.

In a photovoltaic device according to embodiment 5, a transparent conductive film 2 composed of SnO$_2$ so textured that the surface thereof is in an irregular shape is formed on a transparent substrate 1 having insulating properties such as glass, a p-type semiconductor layer 3a composed of p-type amorphous silicon carbide, an intrinsic layer 3b composed of amorphous silicon, and an n-type semiconductor layer 3c composed of n-type amorphous silicon are sequentially laminated on the transparent conductive film 2 as a photoelectric conversion layer 3 for carrying out a photoelectric conversion, and a back electrode 4 composed of a highly-reflective metal such as Ag or Al is further provided on the photoelectric conversion layer 3, as shown in FIG. 13.

In the photovoltaic device according to embodiment 5, in portions of the photoelectric conversion layer 3 which are in contact with recesses 2a of the above described transparent conductive film 2, particles of barium titanate (BaTiO$_2$) 6 are contained as a ferroelectric material 6 in suitable locations of the photoelectric conversion layer 3b.

Description is now made of an example of a method of manufacturing the above described photovoltaic device.

Figure 14A:
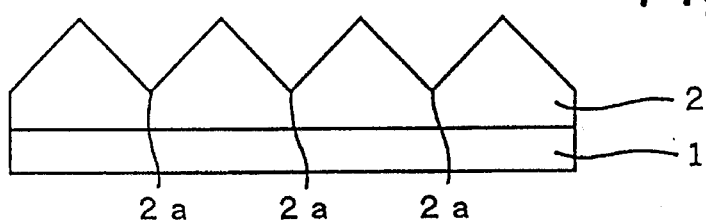
FIGS. 14(A), 14(B), 14(C), 14(D), and 14(E) are diagrams for explaining the steps of manufacturing the photovoltaic device according to embodiment 5.

In the present embodiment, transparent conductive film 2 so textured that the surface thereof is of an irregular shape is first formed by a thermal CVD method or the like on the above described transparent substrate 1, as shown in FIG. 14(A).

Figure 14B:
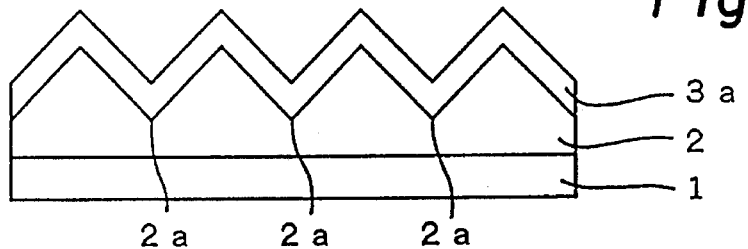

The p-type semiconductor layer 3a is then formed on the transparent conductive film 2 formed in the above described manner under the film-forming conditions indicated by the following table 5 by a plasma CVD method or the like, as shown in FIG. 14(B). The thickness of the p-type semiconductor layer 3a is set in the range of 50 to 200 Å.

Figure 14C:
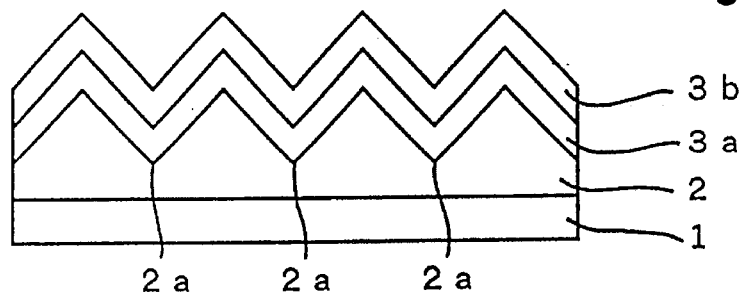

Thereafter, the above described intrinsic layer 3b is formed on the p-type semiconductor layer 3a under the film-forming conditions indicated by the following table 5 by the plasma CVD method or the like, such that the initial thickness thereof is approximately 500 Å, as shown in FIG. 14(C).

Figure 14D:
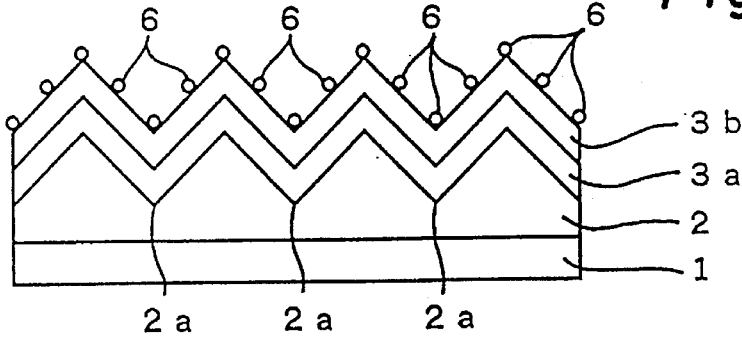
Figure 14E:
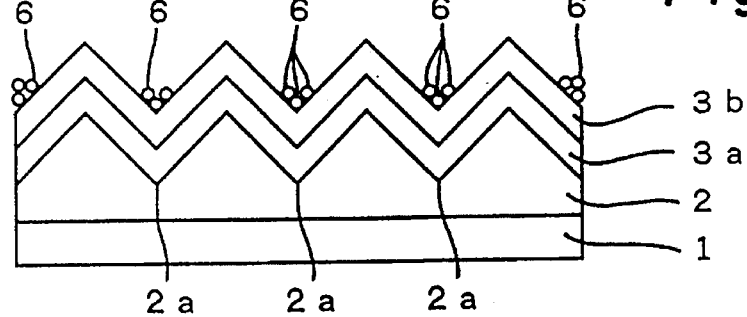

BaTiO$_3$ is then sputtered on the surface of the intrinsic layer 3b thus formed under the sputtering conditions shown in the following table 6, the particles of BaTiO$_3$ 6 being deposited on the surface of the intrinsic layer 3b, as shown in FIG. 14(D), after which ultrasonic waves are applied to the intrinsic layer 3b to which the particles of BaTiO$_3$ 6 are deposited, thereby accumulating the particles of BaTiO$_3$ 6 dispersed on the surface of the intrinsic layer 3b in the recessed portions of the intrinsic layer 3b corresponding to the recesses 2a of the above described transparent conductive film 2, as shown in FIG. 4(E).

A further intrinsic layer 3b is then formed on the intrinsic layer 3b under the same conditions in a state where the particles of BaTiO$_3$ 6 are thus collected in the recessed portions of the intrinsic layer 3b, so that the thickness of the entire intrinsic layer 3b becomes approximately 1000 to 10000 Å, after which the n-type semiconductor layer 3c is formed under the film-forming conditions indicated by the following table 5 on the intrinsic layer 3b such that the thickness thereof is approximately 100 to 500 Å, and the back electrode 4 is further formed on the n-type semiconductor layer 3c, thereby to manufacture the photovoltaic device according to embodiment 5 shown in FIG. 13.

TABLE 5

| | Film-forming Conditions | | | |
|---|---|---|---|---|
| | substrate temperature (°C.) | pressure (Torr) | RF power (W) | gas flow rate (sccm) |
| p-type semi-conductor layer | 80–150 | 0.1–0.5 | 5–20 | SiH$_4$: 10 CH$_4$: 100 B$_2$H$_6$: 30 |
| intrinsic | 80–400 | 0.1–0.5 | 5–30 | SiH$_4$: 100 |
| n-type semi-conductor | 80–400 | 0.1–0.5 | 5–30 | SiH$_4$: 40 PH$_3$: 40 |

TABLE 6

| | Sputtering Conditions | | | | |
|---|---|---|---|---|---|
| substrate temperature (°C.) | pressure (Torr) | time (min) | RF power (W) | gas flow rate (sccm) | |
| room temperature –200 | 1 × 10$^{-3}$ | 1–10 | 200–400 | O$_2$: 0–5 Ar: 1–30 | |

Figure 15:
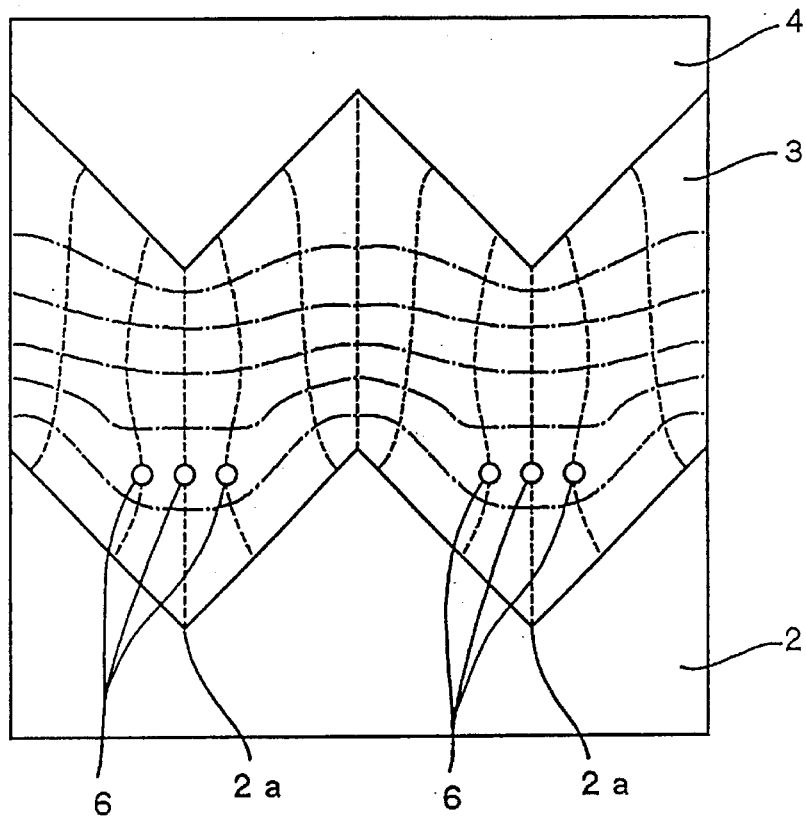
FIG. 15 is a partially enlarged view for explaining a state where lines of electric force and equipotential lines are distributed in a photoelectric conversion layer containing a ferroelectric material in the photovoltaic device according to embodiment 5.

Referring to FIG. 15, in the photovoltaic device according to embodiment 5, the ferroelectric material 6 composed of the particles of BaTio$_3$ 6 is contained in portions of the intrinsic layer 3b on the side of the transparent conductive film 2 inside the photoelectric conversion layer 3 at the portions of the photoelectric conversion layer 3 which are in contact with the recesses 2a of the transparent conductive film 2, the lines of electric force indicated by broken lines inside the photoelectric conversion layer 3 are attracted by the ferroelectric material 6 contained therein, and the density of the lines of electric force in these portions is increased. Consequently, in the portions of the photoelectric conversion layer 3 which are in contact with the recesses 2a of the transparent conductive film 2, the intervals between the lines of electric force in the portions on the side of the transparent conductive film 2 is decreased. Consequently, the internal electric field in the portions is increased so that the internal electric fields in the portions and the other portions are made uniform.

As a result, in the photovoltaic device according to embodiment 5, the possibility that the internal electric field in the portions of the photoelectric conversion layer 3 which are in contact with the recesses 2a of the transparent conductive film 2 becomes weak as in the conventional example is eliminated, whereby the internal electric field in the photoelectric conversion layer 3 is made uniform even when the transparent conductive film 2 so textured as to be in an irregular shape is formed on the transparent substrate 1, thereby reducing the possibility that charge carriers generated in the photoelectric conversion layer 3 recombine in the portions of the p-type semiconductor layer 3a which are in contact with the recesses 2a of the transparent conductive film 2. As a result, the fill factor in the photovoltaic device is improved, thereby improving conversion efficiency.

Figure 1:
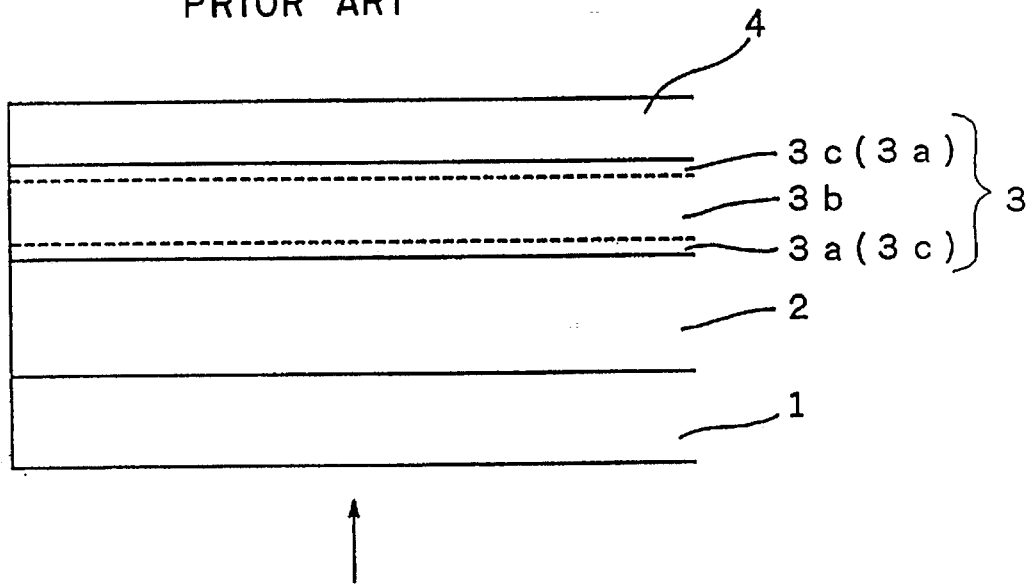
FIG. 1 is a schematic diagram showing a conventional photovoltaic device in which the interface between a transparent conductive film and a photoelectric conversion layer is flat.
Figure 16:
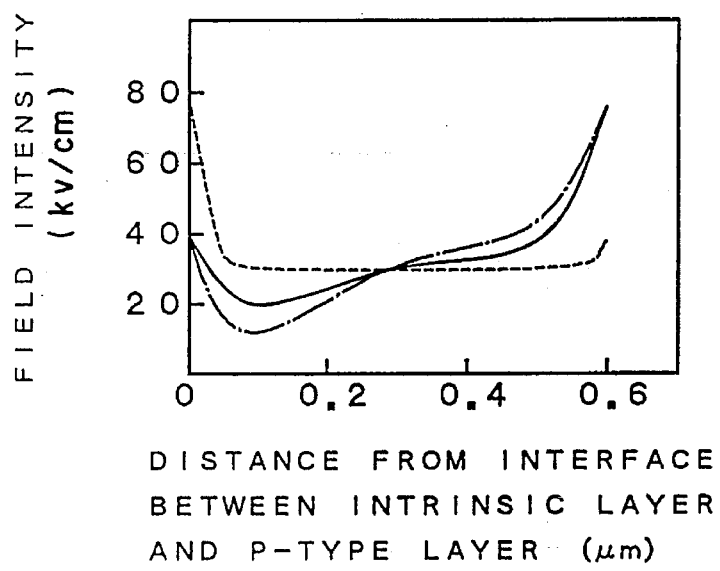
FIG. 16 is a diagram showing the relationship between the depth of an intrinsic layer and the electric field intensity in the photovoltaic crevice according to embodiment 5, a photovoltaic device of comparative example 4, and a photovoltaic device of comparative example 5.

A photovoltaic device according to embodiment 5, a photovoltaic device of a comparative example 4 in which the ferroelectric material 6 is not contained in the intrinsic layer 3b inside the photoelectric conversion layer 3 which are in contact with the recesses 2a of the transparent conductive film 2, and a photovoltaic device of a comparative example 5 in which the interface between the transparent conductive film 2 and the photoelectric conversion layer 3 is flat as shown in FIG. 1, were then examined to determine how the field intensity in the intrinsic layer 3b is changed from the interface between the photoelectric layer 3b and the p-type semiconductor layer 3a to the inside of the intrinsic layer 3b. The results are graphically shown in FIG. 16. In FIG. 16, the changes in the field intensity are respectively indicated by a solid line for embodiment 5, a dot and dash line for the comparative example 4, and a broken line for the comparative example 5.

It is seen that the field intensity in the intrinsic layer 3b is hardly changed even if the distance from the interface between the intrinsic layer 3b and the p-type semiconductor layer 3a is changed in the photovoltaic device of comparative example 5 in which the interface between the transparent conductive film 2 and the photoelectric conversion layer 3 is flat, while it is significantly decreased in the range of approximately 2000 Å from the interface between the intrinsic layer 3b and the p-type semiconductor layer 3a in the photovoltaic device of comparative example 4 in which the interface between the transparent conductive film 2 and the photoelectric conversion layer 3 is in an irregular shape. On the other hand, in the photovoltaic device of embodiment 5, the field intensity in the range of approximately 2000 Å from the interface between the intrinsic layer 3b and the p-type semiconductor layer 3a is not significantly decreased irrespective of the fact that the interface between the transparent conductive film 2 and the photoelectric conversion layer 3 is formed in an irregular shape as in the photovoltaic device of comparative example 4. The photovoltaic device of embodiment 5 enters a state close to the photovoltaic device in the comparative example 5 in which the interface between the transparent conductive film 2 and the photoelectric conversion layer 3 is flat.

In the photovoltaic device of comparative example 5 the field intensity in the intrinsic layer 3b is hardly changed even if the distance from the interface between the intrinsic layer 3b and the p-type semiconductor layer 3a is changed. Even so, there are no effects in a case where the interface between the transparent conductive film 2 and the photoelectric conversion layer 3 is formed in an irregular shape. For example, refraction of light from the interface between the transparent conductive film 2 and the photoelectric conversion layer 3 is reduced when the light is introduced into the photoelectric conversion layer 3 through the transparent conductive film 2 so that the amount of the light introduced into the photoelectric conversion layer 3 is increased and light introduced into the photoelectric conversion layer 3 is scattered so that the optical path length of the light passing through the photoelectric conversion layer 3 is increased, thereby increasing the short-circuit current. Accordingly, light is not effectively utilized, resulting in inferior conversion efficiency, as compared with the above described embodiment 5.

Figure 17:
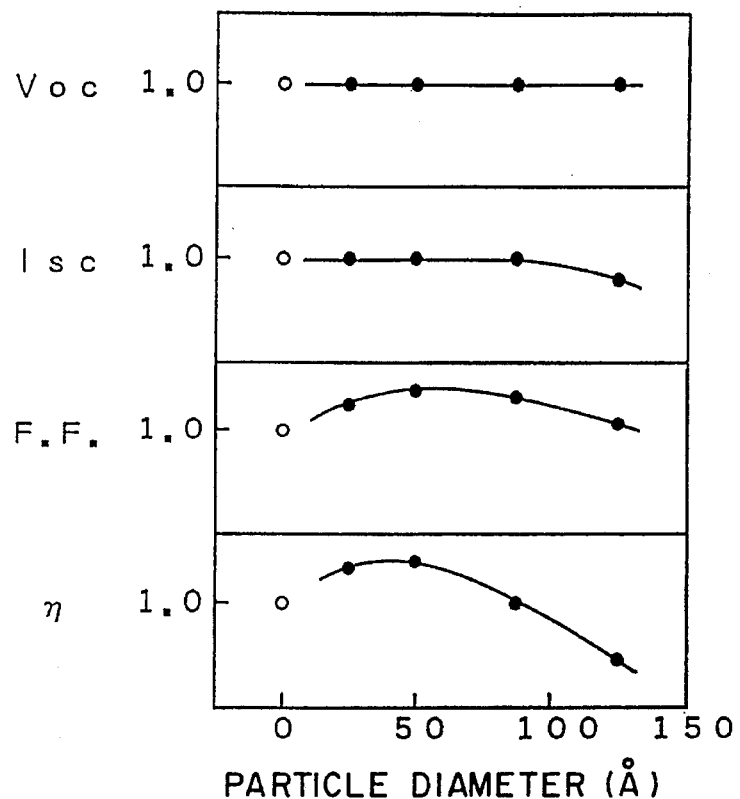
FIG. 17 is a diagram showing the relationship between the diameter of particles of the ferroelectric material contained in the intrinsic layer and respective characteristics in the photovoltaic device according to the embodiment 5.

The average diameter of the particles of $BaTiO_3$ 6 contained in the intrinsic layer 3b inside the photoelectric conversion layer 3 which are in contact with the recesses 2a of the transparent conductive film 2 as described above may be changed. The relationship between the average diameter of the particles of $BaTiO_3$ 6 contained in the intrinsic layer 3b and the open-circuit voltage (Voc), short-circuit current (Isc), fill factor (F.F.), and conversion efficiency ($\eta$) of the photovoltaic device was determined. The results are shown in FIG. 17.

As a result, if the particles of $BaTiO_3$ 6 have an average diameter in the range of 10 to 80 Å, the fill factor (F.F.) and the conversion efficiency ($\eta$) of the photovoltaic device are improved. Accordingly, it is found that particles of $BaTiO_3$ 6 whose diameter is in this range are preferably used.

Figure 18:
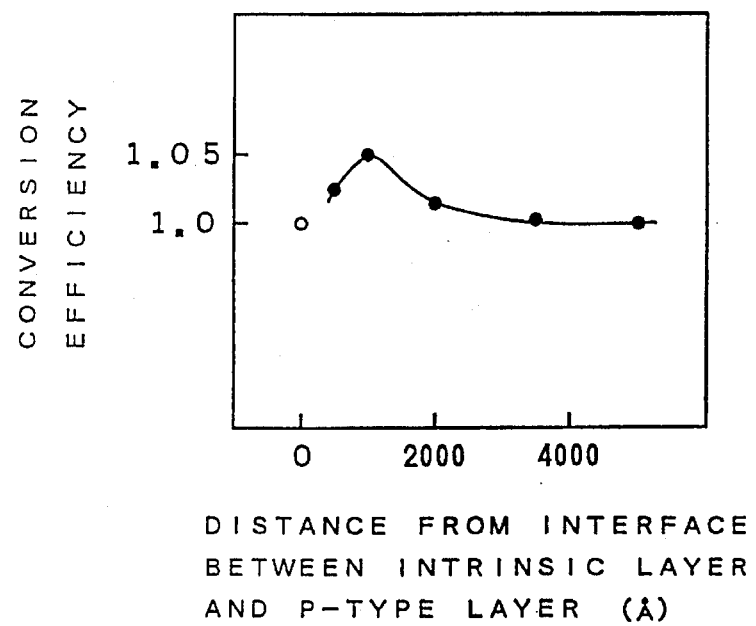
FIG. 18 is a diagram showing the relationship between the position of the ferroelectric material contained in the intrinsic layer and conversion efficiency of the photovoltaic device according to embodiment 5.

Furthermore, in containing the particles of $BaTiO_3$ 6 in the intrinsic layer 3b in the portion of the photoelectric conversion layer 3 which are in contact with the recesses 2a of the transparent conductive film 2 as described above, the position where the particles of $BaTiO_3$ 6 are contained was changed in order to determine the relationship between the distance from the interface between the intrinsic layer 3b and the p-type semiconductor layer 3a and the conversion efficiency of the photovoltaic device. The results are shown in FIG. 18. It is assumed herein that the thickness of the entire intrinsic layer 3b is approximately 5000 Å.

As a result, when the particles of $BaTiO_3$ 6 are contained in the intrinsic layer 3b at a distance in the range of 1000 to 1200 Å from the interface between the intrinsic layer 3b and the p-type semiconductor layer 3a, the conversion efficiency in the photovoltaic device is improved by approximately 5%.

Although in the photovoltaic device in embodiment 5, the particles of $BaTiO_3$ 6 are preferably contained at a position approximately 500 Å away from the interface between the intrinsic layer 3b and the p-type semiconductor layer 3a on the basis of the above results, the position where the particles of $BaTiO_3$ 6 are contained can be freely adjusted by changing the thickness of the intrinsic layer portion 3b first deposited. For example, when the state of irregularities of the interface between the transparent conductive film 2 and the photoelectric conversion layer 3 and the thickness of the entire intrinsic layer 3b are changed so that the position where the internal electric field is weak inside the photoelectric conversion layer 3 is changed, the thickness of the first portion of the intrinsic layer 3b is changed to change the position where the particles of $BaTiO_3$ 6 are contained.

Although in the present embodiment, only an example of a case where the particles of $BaTiO_3$ 6 are used as the ferroelectric material 6 is illustrated, approximately the same effect is obtained when the particles of $BaTiO_3$ 6 are replaced with a transparent ferroelectric material 6 having a dielectric constant of not less than 20, such as $PbTiO_3$, $LiNbO_3$, $LiTaO_3$, and SbSI.

Furthermore, although also in the present embodiment, a photoelectric conversion layer 3 having a structure in which a p-type semiconductor layer 3a, an intrinsic layer 3b, and an n-type semiconductor layer 3c are sequentially laminated is illustrated, it may have a structure in which an n-type semiconductor layer 3c, an intrinsic layer 3b, and a p-type semiconductor layer 3a are sequentially laminated. In this case, in the portions of the photoelectric conversion layer 3 which are in contact with the recesses 2a of the transparent conductive film 2, the above described ferroelectric material 6 is contained in the portion of the intrinsic layer 3b, on the side of the n-type semiconductor layer 3c.

Additionally, also in the photovoltaic device according to the present embodiment 5, only an example of a case where the interface between the photoelectric conversion layer 3 and the transparent conductive film 2 is formed in the irregular shape so that the internal electric field in the photoelectric conversion layer 3 becomes non-uniform in the surface direction of the layer is illustrated. Even when the internal electric field in the photoelectric conversion layer 3 becomes non-uniform in the surface direction of the layer due to other causes, however, it is still possible to make the internal electric field in the photoelectric conversion layer 3 uniform to some extent to improve the fill factor in the photovoltaic device by containing the above described ferroelectric material 6 in the intrinsic layer 3b in a portion of the photoelectric conversion layer 3 where the internal electric field becomes weak as described above.

Furthermore, although in the respective photovoltaic devices in the above described embodiments 1 to 5, only an example in which the photoelectric conversion layer 3 is composed of an amorphous semiconductor is illustrated, the photoelectric conversion layer can be also composed of a crystalline semiconductor. If the photoelectric conversion layer is thus composed of a crystalline semiconductor, the p-type semiconductor layer and the n-type semiconductor layer themselves function as semiconductor layers for generating charge carriers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device having a photoelectric conversion layer which is constituted by a semiconductor film having a semiconductor layer for absorbing light to generate charge carriers therein provided in its inner portion, wherein the thickness of this semiconductor layer for absorbing light to generate charge carriers in portions of the photoelectric conversion layer where an internal electric field intensity is the photoelectric conversion layer is weak is smaller than that in the other portion of the photoelectric conversion layer to compensate for variations in the distribution of the internal electric field intensity in the photoelectric conversion layer.

2. A photovoltaic device in which a photoelectric conversion layer is laminated on a transparent conductive film having an irregular shape formed on its surface, wherein the thickness of the semiconductor layer for absorbing light to generate charge carriers in portions of the photoelectric conversion layer which are in contact with recesses of the transparent conductive film is smaller than that in the other portions of the photoelectric conversion layer to compensate for variations in the distribution of the internal electric field intensity in the photoelectric conversion layer.

3. A photovoltaic device in which a photoelectric conversion layer is laminated on a transparent conductive film having an irregular shape formed on its surface, wherein the transparent conductive film is provided with irregularities by a method utilizing the variation in the intensity of light caused by interference fringes of the light, and the semiconductor layer for absorbing light to generate charge carriers is provided with irregularities to irradiate light having interference fringes at the time of forming a transparent conductive film and a semiconductor layer and controlling the reaction at the time of the film formation utilizing the variation in intensity of light caused by the interference fringes, to form irregularities in the transparent conductive film and the semiconductor layer to compensate for variations in the distribution of the internal electric field intensity in the photoelectric conversion layer.

4. A photovoltaic device in which a photoelectric conversion layer and a transparent conductive film are in contact with each other, wherein a region where the conductivity is high and the activation energy is lower than that in another region is provided in a portion of the photoelectric conversion layer where an internal electric field intensity is weak to compensate for variations in the distribution of the internal electric field intensity in the photoelectric conversion layer.

5. The photovoltaic device according to claim 4, wherein a region where the activation ratio of a dopant is high is provided as the region where the activation energy is lower.

6. The photovoltaic device according to claim 4, wherein a region where the amount of dopant impurities is large is provided as the region where the activation energy is lower.

7. The photovoltaic device according to claim 4, wherein a region composed of a microcrystalline semiconductor is provided inside an amorphous semiconductor photoelectric conversion layer as the region where the activation energy is lower.

8. The photovoltaic device according to claim 7, wherein the region composed of the microcrystalline semiconductor is provided by a solid phase crystallization method inside the amorphous semiconductor photoelectric conversion layer as the region where the activation energy is lower.

9. The photovoltaic device according to claim 7, wherein the region composed of the microcrystalline semiconductor is provided by laser irradiation inside the amorphous semiconductor photoelectric conversion layer as the region where the activation energy is lower.

10. A photovoltaic device in which a photoelectric conversion layer is laminated on a transparent conductive film having an irregular shape formed on its surface, wherein a region where the conductivity is high and the activation energy is lower than that in another region is provided in a portion of the photoelectric conversion layer which is in contact with a recess of the transparent conductive film to compensate for variations in the distribution of the internal electric field intensity in the photoelectric conversion layer.

11. The photovoltaic device according to claim 10, wherein a region where the activation ratio of a dopant is high is provided as the region where the activation energy is lower.

12. The photovoltaic device according to claim 10, wherein a region where the amount of dopant impurities is large is provided as the region where the activation energy is lower.

13. The photovoltaic device according to claim 10, wherein a region composed of a microcrystalline semiconductor is provided inside an amorphous semiconductor layer as the region where the activation energy is lower.

14. The photovoltaic device according to claim 13, wherein the region composed of the microcrystalline semiconductor is provided by a solid phase crystallization method performed inside the amorphous semiconductor layer as the region where the activation energy is lower.

15. The photovoltaic device according to claim 13, wherein the region composed of the microcrystalline semiconductor is provided by laser irradiation inside the amorphous semiconductor layer as the region where the activation energy is lower.

16. A photovoltaic device having a photoelectric conversion layer having a semiconductor layer for absorbing light to generate charge carriers therein is provided in its inner portion, and a ferroelectric material is contained in the semiconductor layer in a portion of the photoelectric conversion layer where the internal electric field intensity is low in order to compensate for variations of the distribution of the internal electric field intensity in the photoelectric conversion layer.

17. The photovoltaic device according to claim 16, wherein $BaTiO_3$, $PbTiO_3$, $LiNbO_3$, $LiTaO_3$, or SbSI is used as said ferroelectric material.

18. The photovoltaic device according to claim 16, wherein said ferroelectric material is composed of particles having a diameter of not more than 100 Å.

19. In a photovoltaic device in which a photovoltaic conversion layer is laminated on a transparent conductive film having an irregular shape formed on its surface, a ferroelectric material is contained in a portion of the photoelectric conversion layer which is in contact with a recess of the transparent conductive film.

* * * * *